(12) United States Patent
Mar

(10) Patent No.: US 7,940,130 B2
(45) Date of Patent: May 10, 2011

(54) FREQUENCY GENERATOR AND METHOD OF FREQUENCY GENERATION WITH MULTIPLE SAMPLING PHASE DETECTORS

(75) Inventor: Wing J. Mar, Rohnert Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 62 days.

(21) Appl. No.: 12/470,559

(22) Filed: May 22, 2009

(65) Prior Publication Data

US 2010/0295621 A1 Nov. 25, 2010

(51) Int. Cl.
*H03L 7/00* (2006.01)
(52) U.S. Cl. .......................... 331/26; 331/11
(58) Field of Classification Search ............ 331/26, 331/11, 25
See application file for complete search history.

(56) References Cited

U.S. PATENT DOCUMENTS

| | | | | |
|---|---|---|---|---|
| 4,355,288 A | * | 10/1982 | Cottatellucci | 331/12 |
| 4,513,448 A | * | 4/1985 | Maher | 455/265 |
| 5,113,094 A | * | 5/1992 | Grace et al. | 327/119 |
| 5,216,387 A | * | 6/1993 | Telewski et al. | 331/11 |
| 5,900,747 A | | 5/1999 | Brauns | |
| 6,373,344 B1 | * | 4/2002 | Mar | 331/96 |
| 2009/0115534 A1 | | 5/2009 | Imenes et al. | |

OTHER PUBLICATIONS

Skyworks Solutions, Inc., "APN5001: Theory and Application of Sampling Phase Detector", www.skyworksinc.com, Jul. 21, 2005, pp. 1-7.

* cited by examiner

*Primary Examiner* — Joseph Chang

(57) ABSTRACT

A device includes: a plurality of sampling phase detectors, each receiving a sampling signal and a VCO output signal and in response thereto outputting a beat signal representing a frequency and phase difference between the VCO output signal and the sampling signal; a frequency/phase detector receiving a reference signal and a combined beat signal produced by combining the beat signals, and in response thereto producing an error signal representing a phase difference between the reference signal and the combined beat signal; a loop integrator receiving the error signal and in response thereto producing the VCO control signal; a power detector detecting a power level of the combined beat signal; and at least one offset voltage generator adjusting a value of a bias voltage in response to the detected power level of the combined beat signal, and applying the adjusted bias voltage to one of the sampling phase detectors.

20 Claims, 7 Drawing Sheets

FREQUENCY GENERATOR AND METHOD OF FREQUENCY GENERATION WITH MULTIPLE SAMPLING PHASE DETECTORS

BACKGROUND

A voltage controlled oscillator (VCO) is an important component in many communication systems and radar systems. In general, a VCO receives an input control voltage (aka "tuning voltage") and generates an output signal whose frequency changes in response to the control voltage. Any given VCO will have a frequency or tuning range defined by the minimum and maximum frequencies that are generated in response to the range of the control voltage which it is designed to receive. VCOs have been designed to operate in a variety of different frequency bands, including particularly VHF, UHF, and/or microwave frequency bands.

In many applications, the frequency accuracy and stability of a VCO operating in an "open loop" mode is unsatisfactory, because of component tolerances, production tolerances, variations in voltage levels, temperature drift, aging, etc. Accordingly, in many applications a VCO's output signal is frequency and/or phase locked to a more stable frequency source, such as a crystal oscillator, an acoustic resonator device, or the like.

A VCO can be phase locked to a reference oscillator by digital or analog phase lock techniques.

FIG. 1 illustrates one embodiment of a phase-locked loop (PLL). PLL 100 includes a reference oscillator 110 (e.g., a crystal oscillator), a reference frequency divider 120, a digital phase detector 130, a loop filter 140, a VCO 150, and feedback frequency divider 160. In operation, the VCO output frequency $F_{VCO}$ is divided by N to produce the feedback signal of frequency $F_{VCO}/N$, while the reference frequency $F_{REF}$ is divided by M to produce a comparison signal of frequency $F_{REF}/M$. The frequencies $F_{VCO}/N$ and $F_{REF}/M$ are compared by the digital phase detector 130 to produce a control signal which is filtered by loop filter 140 to produce the control voltage $V_{CONTROL}$ for tuning the frequency of VCO 150. Loop filter 140 may take a variety of forms, but it typically a single pole "RC" low pass filter, or a lag-lead filter.

When PLL 100 is locked, then $F_{VCO}/N=F_{REF}/M$, yielding:

$$F_{VCO}=(M/N)*F_{REF} \quad (1)$$

So given a reference frequency $F_{REF}$, by properly selecting divider values M and N one can select a desired output frequency $F_{VCO}$. When the divider values M and N are programmable, then digital PLL 100 may operate as a PLL frequency synthesizer.

One important performance characteristic for a frequency source is the phase noise response of the VCO output signal, x(t). In the case of PLL 100, reference oscillator 110 and VCO 150 both contribute to the phase noise of the output signal. More specifically, the phase noise of the output signal at lower offset or modulation frequencies (e.g., frequencies within the bandwidth of loop filter 140) is controlled primarily by the phase noise of reference oscillator 110, and the phase noise of the output signal at higher offset or modulation frequencies (e.g., frequencies outside the bandwidth of loop filter 140) is controlled primarily by the phase noise of VCO 150.

PLL 100 is self-acquiring and can operate with VCO frequencies over a very wide range. The upper frequency limit of a digital PLL is set by the loop divider. Current high-speed dividers easily allow VCO frequencies up to 20 GHz. However, PLL 100 also has some disadvantages. First, the cost is sometimes uneconomical. Second, the combined noise floor of the feedback frequency divider 160, the reference divider 120, and the digital phase detector 130 can set a floor on the phase noise of the VCO output signal x(t).

FIG. 2 illustrates another embodiment of a phase-locked loop (PLL). PLL 200 includes a reference oscillator 210 (e.g., a crystal oscillator), a sampling phase detector (SPD) 230, a loop amplifier 240, and a VCO 250.

In operation SPD 230 receives the VCO output signal from VCO 250 at frequency $F_{VCO}$, and the reference signal from reference oscillator 210 at frequency $F_{REF}$. SPD 230 acts as a non-continuous phase detector that periodically samples the phase of the VCO output signal from VCO 250. The period of the sample pulse is $1/F_{REF}$, and the sample pulse directly samples the VCO output signal. Thus SPD 230 compares the phase of the two signals which are different in frequency, and outputs a beat signal or error signal Vbeat=Em sin Ø representing the differential phase error between the output signals of VCO 250 and reference oscillator 210. Loop amplifier 240 amplifies the error signal and provides the amplified error signal to VCO 250 to correct the VCO output signal to be in phase with the reference signal from reference oscillator 210. At the same time, loop amplifier 240 acts as a low pass filter and filters out the high frequency mixing products. As a result, the VCO output signal is frequency and phase locked to a harmonic of the reference frequency.

FIG. 3 is a schematic diagram of one embodiment of a sampling phase detector (SPD) 300. SPD 300 includes balancing transformer 310, module 320, and coupling circuit 330. Module 320 includes a step-recovery-diode (SRD) 322 which is connected in parallel with a pair of series-connected diodes (e.g., Schottky diodes) 324 by means of two equal-dimensioned coupling capacitors 326. In one embodiment, module 310 includes a ceramic substrate on which circuit elements 322, 324 and 326 are mounted in film circuit technology (thick or thin film technology). Example embodiments of module 320 include models SPD1101-111, SPD1102-111, and SPD1103-111 by SKYWORKS SOLUTIONS, INC., and the MSPD series SPDs from AEROFLEX/METELICS.

In operation, SRD 322 is controlled by a sampling signal (which in FIG. 2 corresponds to reference signal of frequency $F_{REF}$). The sampling signal arrives at SRD 322 via balancing transformer 310. The terminals of SRD 322 are each connected electrically with an R/C network, and each terminal includes a parasitic inductance L not shown in FIG. 3.

SRD 322 operates by alternately producing and consuming a charge, based on the frequency of the sampling signal. Operation of SRD 322 will be explained with respect to FIG. 4 which illustrates the current through SRD 322 as a function of time in response to a sinusoidal sampling signal.

During a first portion of each sampling cycle of the sampling signal, SRD 322 is forward biased and conducts current as a "normal" diode while it builds up an internal charge. During a subsequent second portion of each sampling cycle of the sampling signal, SRD 322 is then reverse-biased. During the reverse-bias portion of the cycle, initially SRD 322 appears to act as a low impedance and maintains conduction by consuming the internal stored charge that was accumulated during the forward-bias portion of the sampling cycle. However when the stored charge has been fully consumed, the impedance of SRD 322 very quickly returns to its normal reverse impedance, which is very high. As a result, as shown in FIG. 4, SRD begins to "snap-off" at snap time $T_{SNAP}$, and very quickly reverts to zero conduction during a transition time $T_T$.

In SPD 300, SRD 322 depends upon on extremely fast transition time $T_T$ to generate pulses rich in harmonics. By storing charge during the positive-going half cycle of an input sinusoidal sampling signal and then "extracting" that charge during the negative-going half cycle, a voltage pulse with a rise time equivalent to transition time $T_T$ is generated. Accordingly, each time SRD 322 receives a charge during the "forward-bias" portion of the sampling cycle, a comparatively rapid discharge pulse occurs during the "reverse-bias" portion of the sampling cycle which is conducted by means of the coupling capacitors 326 to the diode pair 324.

The discharge pulse from SRD 322 connects the diode pair 324 (a diode arrangement comprising more than two diodes can be used instead of diode pair 324). The phase state of the VCO input signal applied to diode pair 324 from a VCO input 332 is detected by the switching operation of the diode pair 324. Coupling circuit 330 connected to diode pair 324 charges or discharges according to the phase shift between the VCO input signal and the sampling signal. A beat signal representing the above-described phase shift is provided at an IF output 334 of coupling circuit 330. Coupling circuit 330 decouples the beat signal supplied at IF output 334, from the VCO input signal received at VCO input 332.

Turning back to FIG. 2, noise contributions from the reference signal from reference oscillator 210, and loop components such as VCO 250 itself, SPD 230, and loop amplifier 240 can all add to the phase noise of VCO output signal. SPD 230 is typically the dominant noise contributor and thus improving its phase noise directly results in a corresponding improvement to the output noise of the VCO.

What is needed, therefore, is an arrangement for phase-locking a VCO to a reference signal where the VCO output signal's phase noise response is improved.

SUMMARY

In an example embodiment, a phase-locked loop (PLL) comprises: a voltage controlled oscillator (VCO) adapted to receive a control signal and in response thereto to output a VCO output signal having a VCO frequency; a plurality, N, of sampling phase detectors, each of the sampling detectors adapted to receive a sampling signal and the VCO output signal and in response thereto to output a beat signal representing a frequency and phase difference between the VCO output signal and the sampling signal; a phase & frequency detector adapted to receive a reference signal from a reference oscillator, and adapted to receive a combined beat signal produced by combining the beat signals output by the plurality of sampling phase detectors, and in response thereto to produce an error signal representing a phase difference between the reference signal and the combined beat signal; a loop integrator adapted to receive the error signal and in response thereto to produce the control signal for the VCO; a power detector adapted to detect a power level of the combined beat signal; and at least N-1 offset voltage generators, each offset voltage generator being adapted to adjust a value of a corresponding bias voltage in response to the detected power level of the combined beat signal, and to apply the adjusted corresponding bias voltage to a corresponding one of the sampling phase detectors.

In another example embodiment, a method comprises: providing a sampling signal and the VCO output signal to each of a plurality, N, of sampling phase detectors; at each of the sampling phase detectors, outputting a beat signal representing a frequency and phase difference between the VCO output signal and the sampling signal; producing a combined beat signal from the beat signals output by the plurality of sampling phase detectors; providing the combined beat signal and a reference signal from a reference oscillator to a phase & frequency detector; producing at the phase & frequency detector an error signal representing a phase difference between the reference signal and the combined beat signal; integrating the error signal to produce a control signal for tuning a frequency of the VCO output signal; detecting a power level of the combined beat signal; adjusting values of at least N-1 bias voltages in response to the detected power level of the combined beat signal; and applying each of the bias voltages to a corresponding one of the sampling phase detectors.

In yet another embodiment, a device comprises: a plurality of sampling phase detectors, each receiving a sampling signal and a VCO output signal and in response thereto outputting a beat signal representing a frequency and phase difference between the VCO output signal and the sampling signal, each of the sampling phase detectors including a step recovery diode; a phase & frequency detector receiving a reference signal and a combined beat signal produced by combining the beat signals output by the plurality of sampling phase detectors, and in response thereto producing an error signal representing a phase difference between the reference signal and the combined beat signal; a loop integrator receiving the error signal and in response thereto producing the VCO control signal; a power detector detecting a power level of the combined beat signal; and at least one offset voltage generator adjusting a value of a bias voltage in response to the detected power level of the combined beat signal, and applying the adjusted bias voltage to one of the sampling phase detectors so as to adjust a snap time of the step recovery diode in the sampling phase detector.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Figure 1:
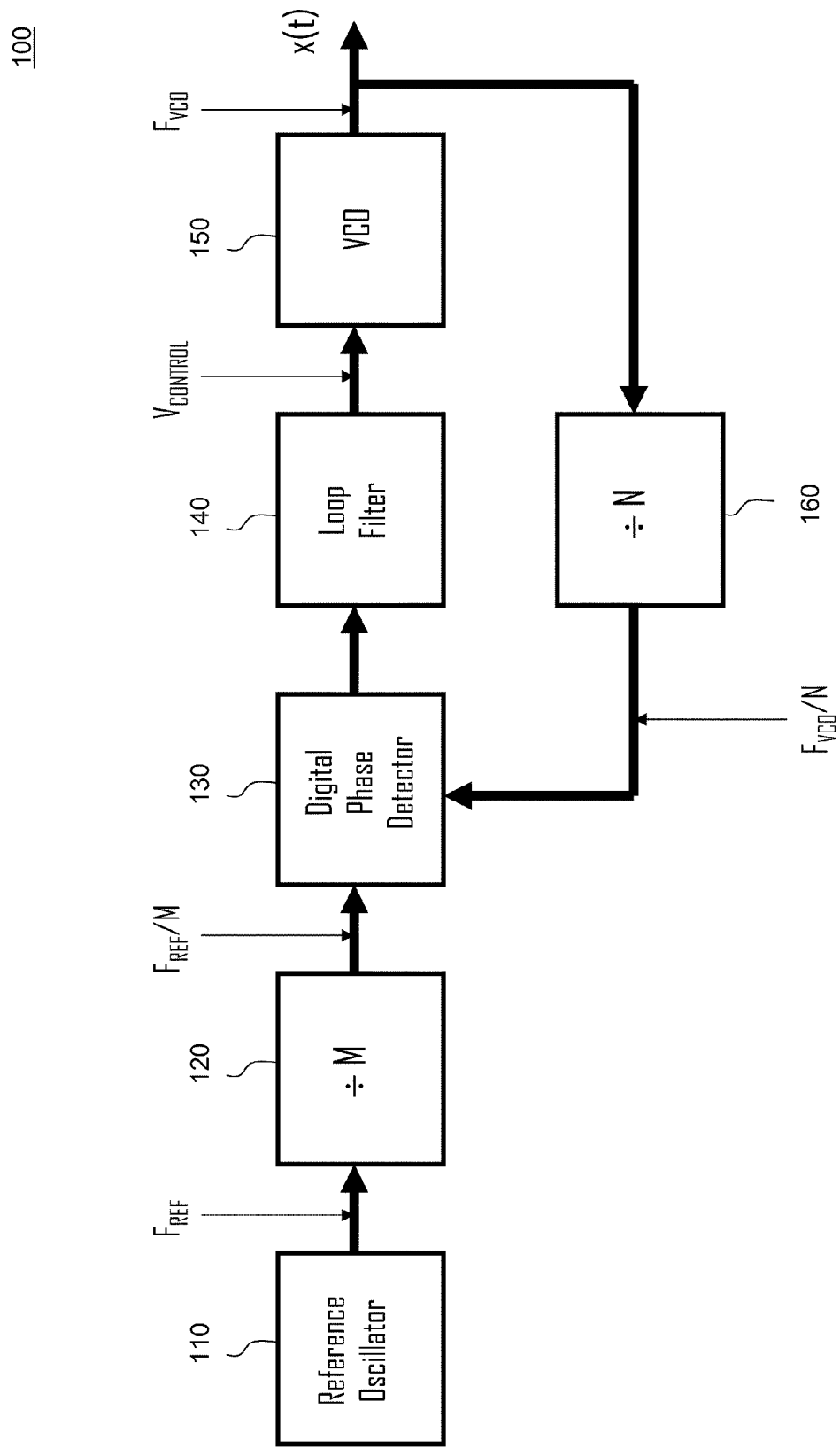
FIG. 1 illustrates one embodiment of a phase-locked loop (PLL).
Figure 2:
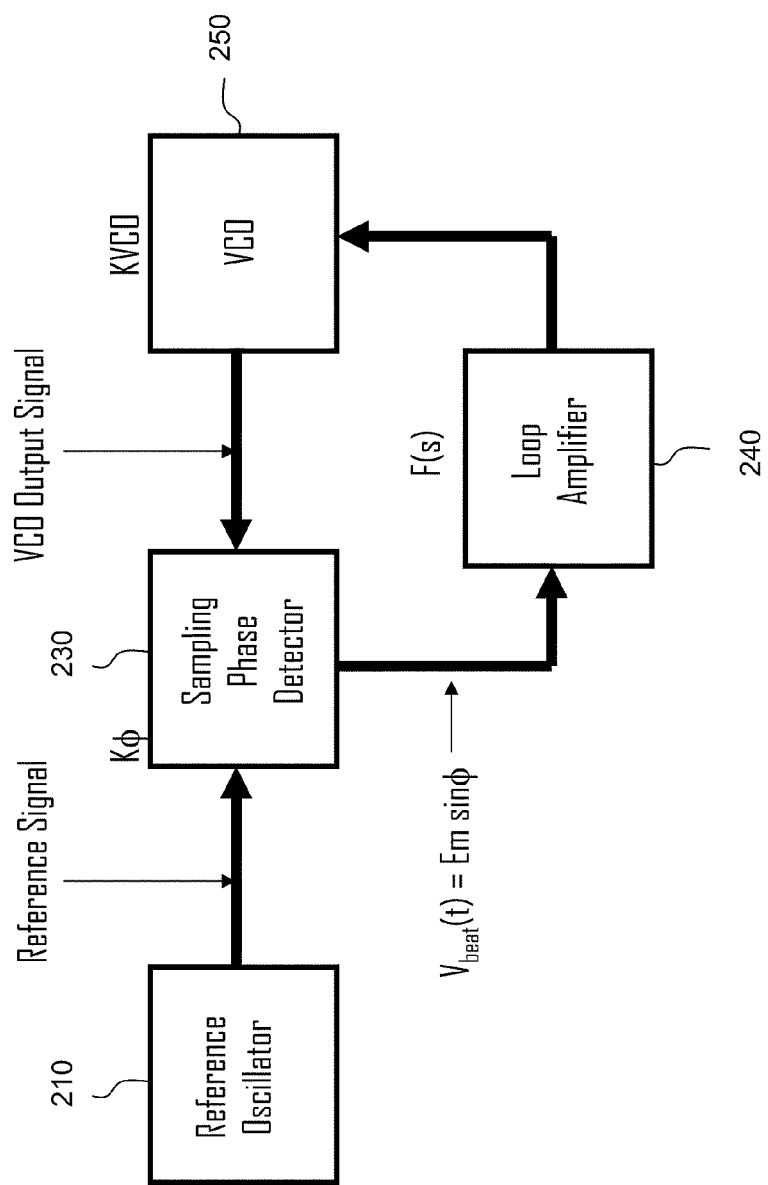
FIG. 2 illustrates another embodiment of a PLL.
Figure 5:
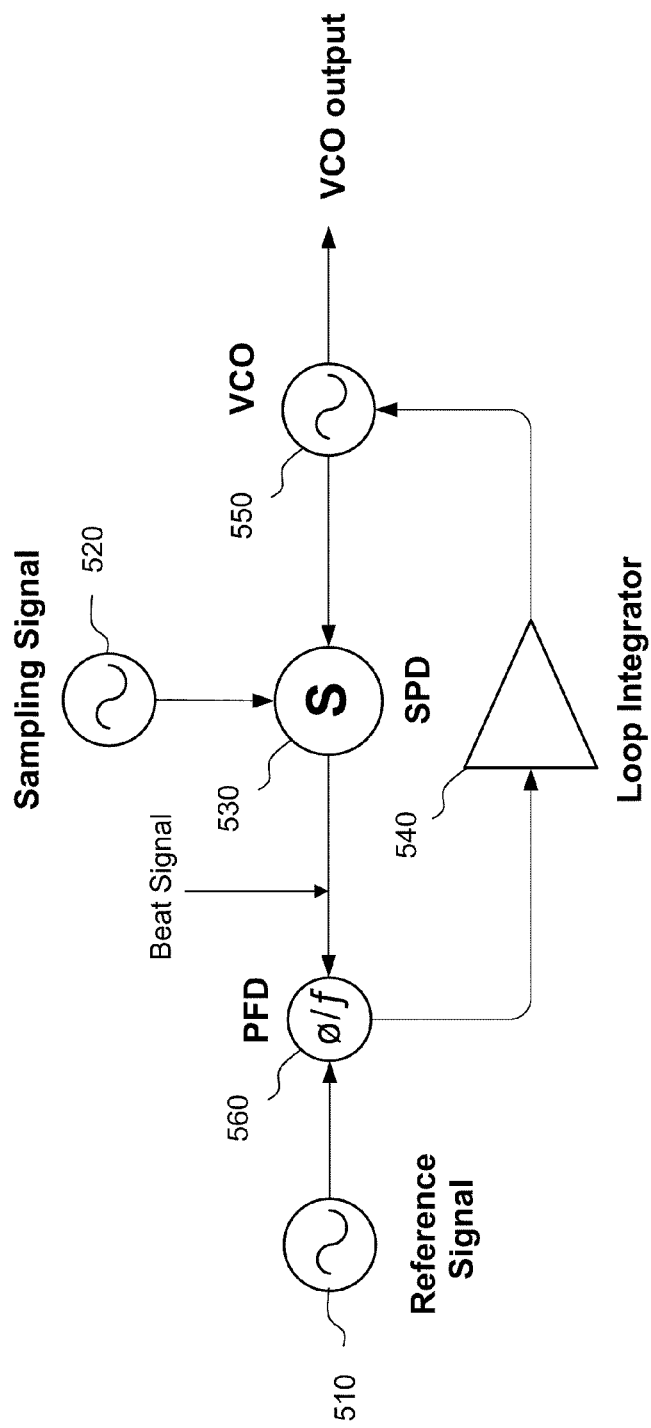
FIG. 5 illustrates an offset PLL.

FIG. 5 illustrates an embodiment of a phase-locked loop (PLL) that utilizes a sampling phase detector. PLL 500 includes a reference oscillator 510 (e.g., a crystal oscillator), a sampling signal generator 520, a sampling phase detector (SPD) 530, a loop integrator 540, a VCO 550, and a phase & frequency detector (PFD) 560. PLL 500 is an offset PLL, and as such in general provides increased flexibility in frequency tuning compared to PLL 200 shown in FIG. 2.

In operation of PLL 500, a VCO output signal is supplied to a VCO input of SPD 530, and a sampling signal is supplied to a sampling signal input of SPD 530, and in response thereto SPD 530 provides a beat signal to phase & frequency detector 560 via an IF output of SPD 530. Phase & frequency detector 560 compares the phase and frequency of the beat signal to the phase and frequency of the reference signal from reference oscillator 510, and in response thereto generates an error signal, which is integrated by loop integrator 540 to provide the control signal for tuning the frequency of VCO 550. When PLL 500 is locked, the frequency of VCO 550 is:

$$F_{VCO} = H \cdot F_S \pm F_{REF}, \quad (2)$$

where $F_S$ is the sampling frequency of the sampling signal from sampling signal generator 520, H is the harmonic of Fs, and $F_{REF}$ is the reference frequency of the reference signal from reference oscillator 510.

From equation (2) it can be seen that the output frequency of VCO 550, $F_{VCO}$, thus tracks 1:1 with changes in the frequency $F_{REF}$ of reference oscillator 510, and tracks H:1 with respect to changes in the frequency of sampling signal generator 520. Likewise, phase noise from reference oscillator 510 is transferred with a gain of 0 dB to the output signal of VCO 550, and phase noise from sampling signal generator 520 is transferred with a gain of 20*log(H) dB to the output signal of VCO 550. In addition noise contributions from the input signals, loop components such as VCO 550 itself, SPD 530, phase & frequency detector 560, and loop amplifier 540 can all add to the phase noise of the VCO output signal. SPD 530 is typically the dominant noise contributor, and thus improving its phase noise directly results in a corresponding improvement to the output noise the VCO output signal.

Now consider a PLL where N identical SPD devices are each connected "in parallel" such that each SPD device receives the same sampling signal and the same VCO output signal. If the "beat signals" output by N identical SPD devices are summed together to produce a combined beat signal, and if all of the beat signals are coherent, then the signal power in the combined beat signal is increased by 20*log(N) dB with respect to the signal power of any one of the beat signals. Beneficially, however, in general the noise output by each of the N SPD devices is uncorrelated to the noise of each of the other N−1 SPD devices. Accordingly, the noise power in the combined eat signal is increased only by 10*$\log_{10}$(N) dB with respect to the noise power of any one of the beat signals. The net result is an improvement in the signal-to-noise ratio (SNR) of 10*$\log_{10}$(N) dB of the combined beat signal with respect to the SNR of any one of the individual beat signals.

However when multiple SPDs are used to reduce the overall phase noise, the main difficulty is to maintain the same phase relationship among all of beat signals to be summed so that the beat signals are all coherent and the signal power in the combined beat signal is increased by 20*$\log_{10}$(N) dB as described above. There is often considerable variation in the characteristics of each SPD, and particularly the "snap time" of the SRDs in the SPDs, requiring careful matching of devices to achieve a good result. Trying to achieve good matching of SPD devices across a broad operating frequency range is even more difficult to achieve, so that a device-matching technique is generally not suitable for production designs.

Figure 6:
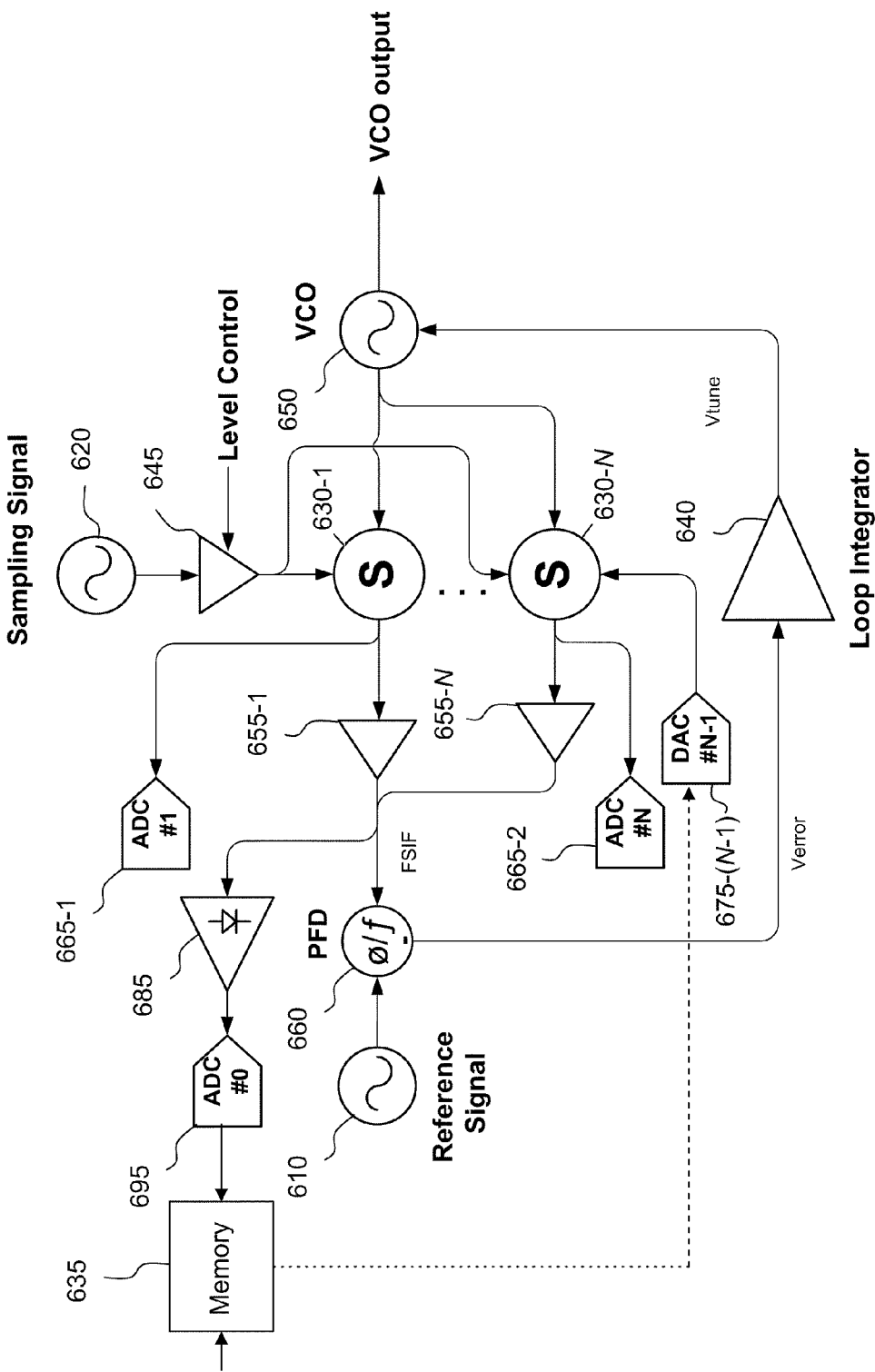
FIG. 6 illustrates on embodiment of a PLL that includes two or more sampling phase detectors (SPD).

FIG. 6 illustrates one embodiment of a phase-locked loop (PLL) 600 that includes two or more sampling phase detectors (SPD). PLL 600 includes a reference oscillator 610 (e.g., a crystal oscillator), a sampling signal generator 620, N sampling phase detectors (SPD) 630-1 . . . 630-N, a loop integrator 640, a VCO 650, and a phase & frequency detector (PFD) 660. PLL 600 also includes a memory device 635, a sampling signal level controller 645, N beat signal amplifiers 655-1~655-N, N beat signal sampling circuits 665-1~665-N, N−1 offset voltage generators 675-1~675-(N−1), a power detector 685, and an analog-digital-converter (ADC) 695.

In the embodiment of FIG. 6: sampling signal level controller 645 includes an amplifier with a level control input; beat signal sampling circuits 665-1~655-N each comprise an analog-to-digital converter (ADC); and offset bias voltage generators 675-1~675-N−1 each comprise a digital-to-analog converter (DAC).

In operation, in PLL 600 SPDs 630-1 to 630-N are all driven by the same sampling signal and all sample the same VCO output signal. Beneficially, sampling signal level controller 645 includes a level-controlled amplifier, and the sampling signal is amplified by the amplifier to produce enough signal drive to all of the SPDs 630-1~630-N. The sampling diodes of each SPD, in addition to producing the beat signal, produce a DC voltage proportional to the sampler drive level and this DC voltage is output at the IF output of the SPD. By monitoring the DC output voltage of one of the SPDs using beat signal sampling circuit 665-1, the sampling signal drive level can be monitored and adjusted through the level control of sampling signal level controller 645. Additional beat signal sampling circuits 665-2~665-N can be employed to monitor the DC output of all of the SPDs 630-1~630-N to ascertain the operation of the SPDs.

Beat signal amplifiers 655-1~655-N are buffer amplifiers that match the high output impedance of the corresponding SPD 630-2~630-N. The beat signals output by beat signal amplifiers 655-1~655-N are summed together to produce a combined beat signal. Power detector 685 detects the power level of the combined beat signal, and the detected power level of the combined beat signal is digitized by ADC 695.

Meanwhile, the combined beat signal is applied to phase & frequency detector (PFD) 660 to provide feedback for PLL 600. The other input to PFD 660 is the reference signal from reference oscillator 610. The output of PFD 660 is an error signal, and the error signal is applied to loop integrator 640 to produce the control voltage to tune VCO 650 to keep it locked to the sampling signal from sampling signal generator 620 and the reference signal from reference oscillator 610.

Beneficially, offset voltage generators 675-1~675-(N−1) are used to adjust the snap times of SPDs 630-2~630-N.

Beneficially, offset voltage generators 675-1~675-(N−1) align the snap times of all of the step recovery diodes in all of the SPDs 630-2~630-N to insure that the beat signals from all of the SPDs add coherently to produce the combined beat signal, so that the combined beat signal exhibits the SNR improvement described above, and the phase noise of the VCO output of PLL 600 is optimized. Since one of the SPDs can be fixed while the others are all adjusted to align to it, only N−1 offset voltage generators 675-1~675-(N−1) are needed to support the N SPDs 630-2~630-N.

In one embodiment, each of the offset voltage generators 675-1~675-(N−1) comprises a DAC that adjusts a bias voltage that is supplied to a corresponding one of the SPDs 630-2~630-N. In one embodiment, the output of the DAC is connected to one of the terminals 632 or 634 of the SPD 300 as shown in FIG. 3 to adjust the bias voltage applied to SRD 322 and thereby adjust the snap time of SRD 322.

Figure 3:
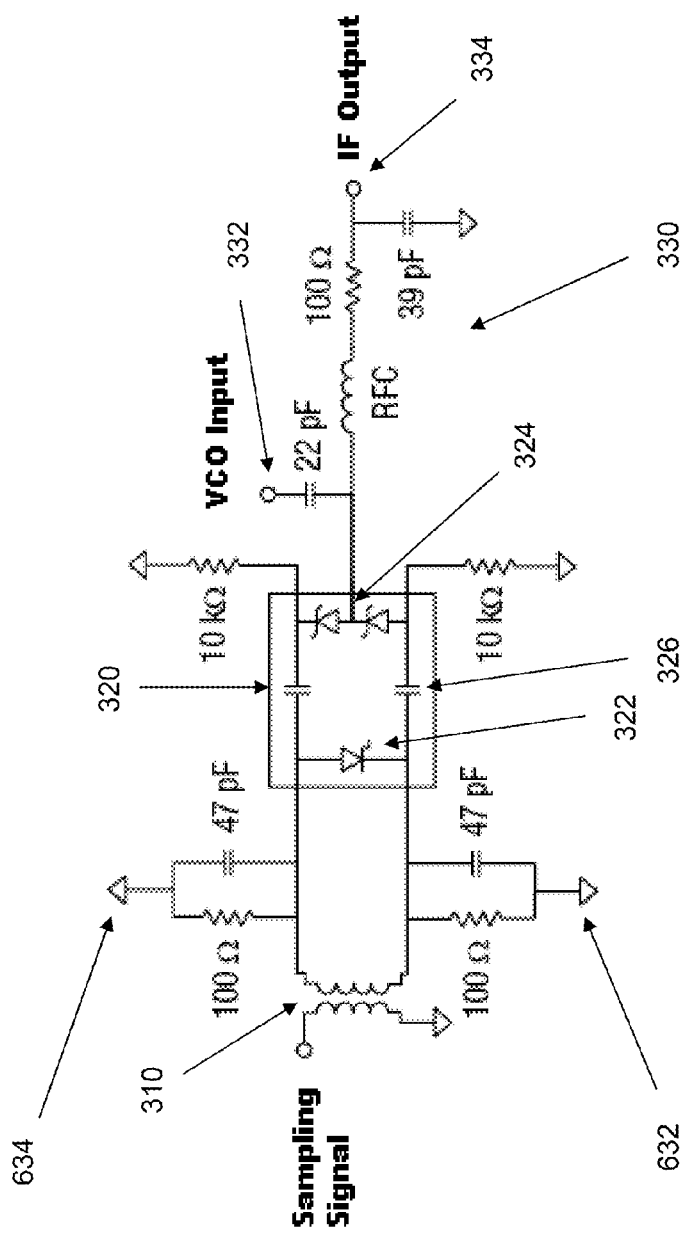
FIG. 3 is a schematic diagram of one embodiment of a sampling phase detector (SPD).
Figure 4:
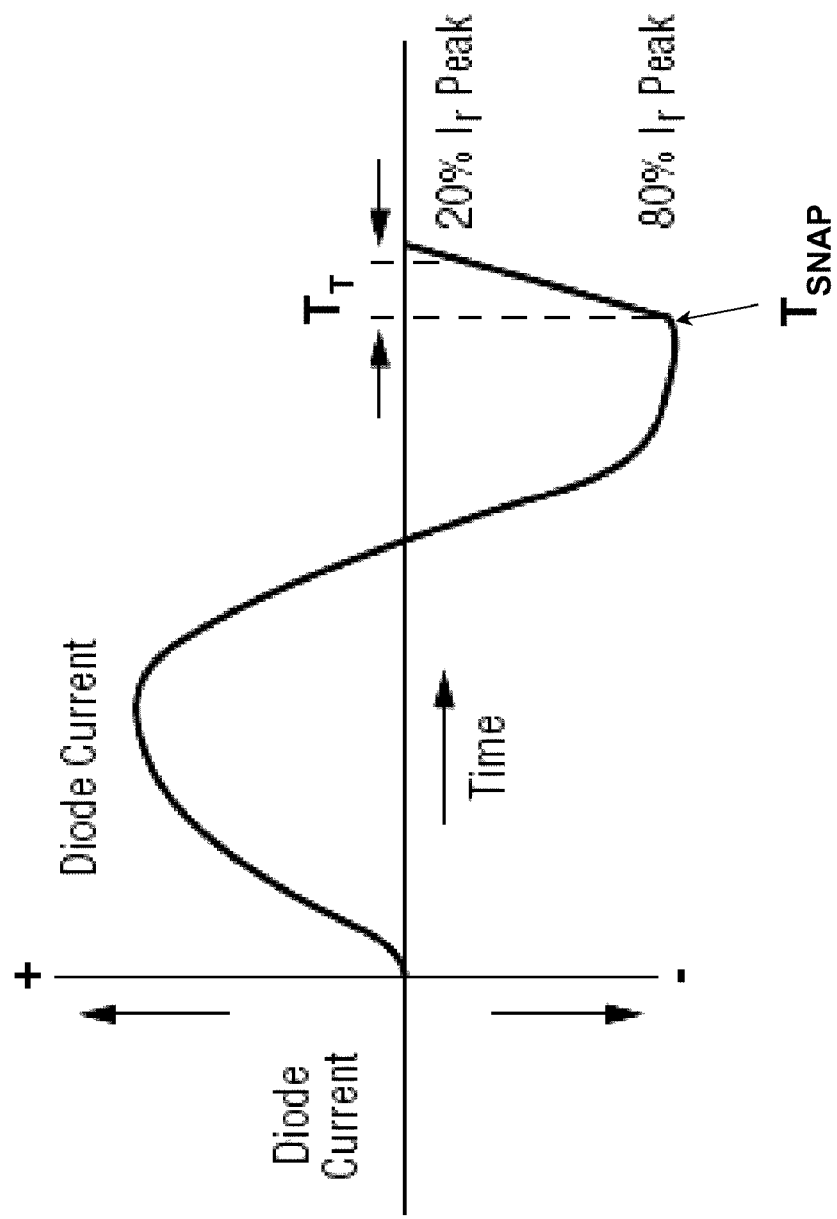
FIG. 4 illustrates the current through a step recovery diode as a function of time in response to a sinusoidal sampling signal.

To provide a concrete example that illustrates exemplary values, one embodiment of PLL 600 of FIG. 6 is now described in greater detail in conjunction with SPD 300 of FIG. 3. In this exemplary embodiment: the sampling signal may have a frequency of 100 MHz and have a power level of 18-19 dBm; the reference oscillator may have a frequency of 25 MHz; the VCO input signal may have a frequency range of 2000 MHz-4000 MHz such that the phase locked VCO can produce output frequencies from 2025 MHz to 3975 MHz in 50 MHz steps; balancing transformer 310 also provides an impedance transformation to present a 50Ω input impedance to the sampling signal; the peak-to-peak sampling signal voltage applied across SRD 322 is in a range of 3-4 volts; the bias voltage applied to terminal 632 by the DAC of an offset voltage generator 675-$i$ is in a range of +0.05 Volts to −0.05 volts; and the transition time TT of SRD 322 is in a range of 30-50 picoseconds. Of course an infinite number of other embodiments may be provided having different values. These values are only provided to illustrate more fully a concrete example, and are not in any way limiting of the scope of embodiments of PLL 600.

In one embodiment, the SNR of the VCO output signal of PLL 600 can be optimized by monitoring the phase noise of the VCO output signal while adjusting offset voltage generators 675-1~675-(N−1). However, this method is not suitable for general usage due to the fact that phase noise measurements are time consuming and often requires specialized equipment not commonly available.

In a beneficial arrangement, the combined beat signal power level and the corresponding phase noise response of the VCO output signal of VCO 650 are characterized at different values of the combined beat signal power level and, beneficially, also at different frequencies spanning the range of operating frequencies of PLL 600. The phase noise profile of the VCO output signal is then correlated to the combined beat signal power level so that offset voltage generators 675-1~675-(N−1) can be controlled to adjust the bias voltages applied to SPDs 630-2~630-N for optimum phase noise using an alignment algorithm. Beneficially, in one embodiment SNR of the VCO output signal is optimized by offset voltage generators 675-1~675-(N−1) adjusting the bias voltages applied to SPDs 630-2~630-N so as to maximize the combined beat signal power level.

In one embodiment, a digital word output by ADC 695 representing the combined beat signal power level is stored in memory 635. The digitized combined beat signal power level may be read from memory 635 and employed by a processor (not shown) to execute a feedback algorithm to determine how each of the offset voltage generators 675-1~675-(N−1) should adjust the bias voltage it applies to its corresponding SPD 630-2~630-N so as to maximize the combined beat signal power level, and thereby optimize the SNR of the VCO output signal.

In one embodiment, a table stored in memory 635 stores digitized bias voltage values to be applied to the N−1 sampling phase detectors by offset voltage generators 675-1~675-(N−1) corresponding to different values of the power level of the combined beat signal.

In one embodiment, memory 635 may be addressed by the digital word output by ADC 695 directly to read and output stored digitized bias voltage values to be utilized by offset voltage generators 675-1~675-(N−1) to adjust the bias voltages applied to the N−1 sampling phase detectors SPD 630-2~630-N.

A variety of other arrangements are possible to generate digitized bias voltage values to be utilized by offset voltage generators 675-1~675-(N−1) to adjust the bias voltages applied to the N−1 sampling phase detectors SPD 630-2~630-N in response to the detected combined beat signal power level.

Figure 7:
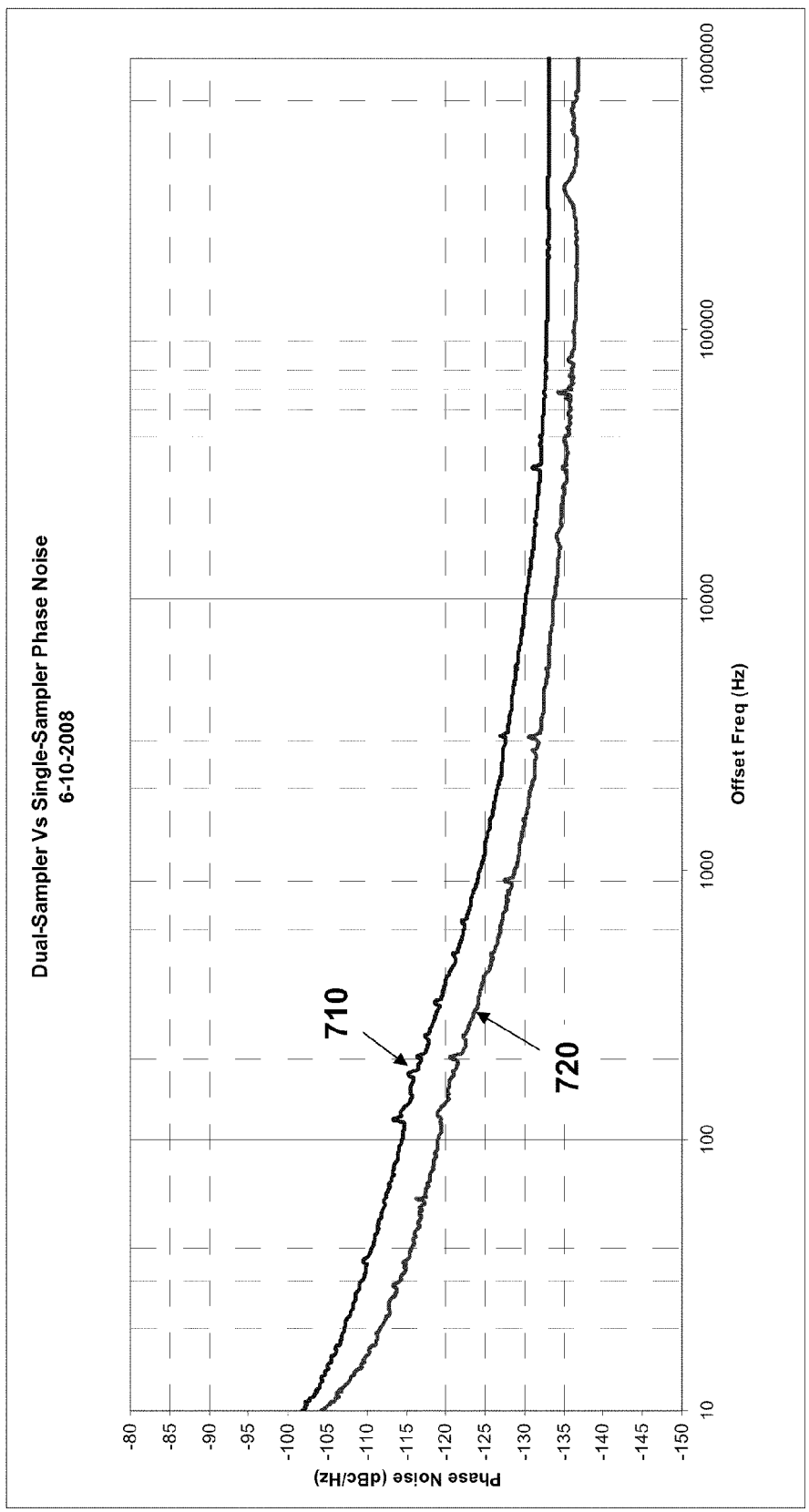
FIG. 7 shows a phase noise characteristics of the output signals of two different PLLs.

FIG. 7 shows exemplary phase noise characteristics of the output signals of two different embodiments of phase-locked loops (PLLs). A top curve 710 illustrates an exemplary phase noise of the beat signal from a single SPD, while bottom curve 720 illustrates an exemplary phase noise of the combined beat signal from two SPDs (N=2). As can be seen in FIG. 7, when N=2 SPDs are employed, the phase noise of the sampler output signal can be generally reduced by $10*\log_{10}(2)=3$ dB, yielding a corresponding improvement in the SNR of the VCO output signal when the sampler is the dominant noise contributor.

While example embodiments are disclosed herein, one of ordinary skill in the art appreciates that many variations that are in accordance with the present teachings are possible and remain within the scope of the appended claims. For example, in FIG. 6 the output signal of VCO 650 is illustrated as being applied directly to the VCO inputs of the SPDs 630-1~630-N. However, it should be understood that the output signal from VCO 650 could have its frequency multiplied, divided, or changed by mixing with another oscillator signal, before it is applied to the VCO inputs of the SPDs 630-1~630-N. Also, the combined beat signal can be applied directly to the loop integrator 640 without needing the reference signal 610 and the phase frequency detector 660 if the VCO output is restricted to only harmonics of the sampling signal. Such variations are in accordance with the present teachings and remain within the scope of the appended claims. The invention therefore is not to be restricted except within the scope of the appended claims.

The invention claimed is:

1. A phase-locked loop (PLL), comprising:
    a voltage controlled oscillator (VCO) adapted to receive a control signal and in response thereto to output a VCO output signal having a VCO frequency;
    a plurality, N, of sampling phase detectors, each of the sampling detectors adapted to receive a sampling signal and the VCO output signal and in response thereto to output a beat signal representing a frequency and phase difference between the VCO output signal and the sampling signal;
    a phase & frequency detector adapted to receive a reference signal from a reference oscillator, and adapted to receive a combined beat signal produced by combining the beat signals output by the plurality of sampling phase detectors, and in response thereto to produce an error signal representing a phase difference between the reference signal and the combined beat signal;

a loop integrator adapted to receive the error signal and in response thereto to produce the control signal for the VCO;

a power detector adapted to detect a power level of the combined beat signal; and at least N−1 offset voltage generators, each offset voltage generator being adapted to adjust a value of a corresponding bias voltage in response to the detected power level of the combined beat signal, and to apply the adjusted corresponding bias voltage to a corresponding one of the sampling phase detectors.

2. The PLL of claim 1, wherein each sampling phase detector comprises:
a step recovery diode;
a balancing transformer adapted to receive the sampling signal and to apply the sampling signal across the step recovery diode;
a pair of diodes connected in series with each other; and
a pair of capacitors connecting either side of the step recovery diode to a corresponding side of the series pair of diodes,
wherein the bias voltage is applied to one side of the step recovery diode.

3. The PLL of claim 1, wherein each of the N−1 offset voltage generators adjusts the value of the bias voltage applied to the corresponding one of the sampling phase detectors so as to maximize the detected power level of the combined beat signal.

4. The PLL of claim 1, wherein each of the sampling phase detectors includes a step recovery diode, and wherein each of the N−1 offset voltage generators adjusts the value of the bias voltage applied to the corresponding one of the sampling phase detectors so as to adjust a snap time of the step recovery diode in the sampling phase detector.

5. The PLL of claim 1, further comprising a memory device that stores bias voltage values to be applied to the N−1 sampling phase detectors corresponding to different values of the power level of the combined beat signal.

6. The PLL of claim 5, wherein the memory device stores bias voltage values to be applied to the N−1 sampling phase detectors corresponding to different values of the power level of the combined beat signal and to different values of the VCO frequency.

7. The PLL of claim 1, further comprising:
at least one circuit for sampling a DC output level of the beat signal from at least one of the sampling phase detectors; and
a circuit for controlling an amplitude of the sampling signal supplied to each of the sampling phase detectors in response to sampled DC output level.

8. The PLL of claim 1, wherein the each of the offset voltage generators includes a digital-to-analog converter.

9. The PLL of claim 1, further comprising a plurality of amplifiers, each amplifier receiving one of the beat signals from the plurality of sampling phase detectors and outputs of the amplifiers being connected together to produce a combined beat signal.

10. A method, comprising:
providing a sampling signal and the VCO output signal to each of a plurality, N, of sampling phase detectors;
at each of the sampling phase detectors, outputting a beat signal representing a frequency and phase difference between the VCO output signal and the sampling signal;
producing a combined beat signal from the beat signals output by the plurality of sampling phase detectors;

providing the combined beat signal and a reference signal from a reference oscillator to a phase & frequency detector;
producing at the frequency and phase detector an error signal representing a phase difference between the reference signal and the combined beat signal;
integrating the error signal to produce a control signal for tuning a frequency of the VCO output signal;
detecting a power level of the combined beat signal;
adjusting values of at least N−1 bias voltages in response to the detected power level of the combined beat signal; and
applying each of the bias voltages to a corresponding one of the sampling phase detectors.

11. The method of claim 10, wherein the N−1 bias voltages are adjusted so as to maximize the detected power level of the combined beat signal.

12. The method of claim 10, wherein each of the sampling phase detectors includes a step recovery diode, and wherein the N−1 bias voltages are adjusted so as to adjust a snap time of the step recovery diode in the sampling phase detector.

13. The method of claim 10, further comprising retrieving bias voltage values to be applied to the N−1 sampling phase detectors from a memory device in response to the power level of the combined beat signal.

14. The method of claim 10, further comprising retrieving bias voltage values to be applied to the N−1 sampling phase detectors from a memory device in response to the power level of the combined beat signal and to a frequency of the VCO signal.

15. The method of claim 10, further comprising:
sampling a DC output level of the beat signal from at least one of the sampling phase detectors; and
controlling an amplitude of the sampling signal supplied to each of the sampling phase detectors in response to sampled DC output level.

16. A device, comprising:
a plurality of sampling phase detectors, each receiving a sampling signal and a VCO output signal and in response thereto outputting a beat signal representing a frequency and phase difference between the VCO output signal and the sampling signal, each of the sampling phase detectors including a step recovery diode;
a phase & frequency detector receiving a reference signal and a combined beat signal produced by combining the beat signals output by the plurality of sampling phase detectors, and in response thereto producing an error signal representing a phase difference between the reference signal and the combined beat signal;
a loop integrator receiving the error signal and in response thereto producing the VCO control signal;
a power detector detecting a power level of the combined beat signal; and
at least one offset voltage generator adjusting a value of a bias voltage in response to the detected power level of the combined beat signal, and applying the adjusted bias voltage to one of the sampling phase detectors so as to adjust a snap time of the step recovery diode in the sampling phase detector.

17. The device of claim 16, wherein each sampling phase detector comprises:
the step recovery diode;
a balancing transformer adapted to receive the sampling signal and to apply the sampling signal across the step recovery diode;
a pair of diodes connected in series with each other; and a pair of capacitors connecting either side of the step recovery diode to a corresponding side of the series pair of diodes, wherein the bias voltage is applied to one side of the step recovery diode.

18. The device of claim 16, wherein each of the at least one offset voltage generator adjusts the value of the bias voltage applied to the corresponding one of the sampling phase detectors so as to maximize the detected power level of the combined beat signal.

19. The device of claim 16, wherein each of the at least one offset voltage generator adjusts the value of the bias voltage applied to the corresponding one of the sampling phase detectors so as to adjust a snap time of the step recovery diode in the sampling phase detector.

20. The device of claim 16, further comprising:
at least one circuit for sampling a DC output level of the beat signal from at least one of the sampling phase detectors; and
a circuit for controlling an amplitude of the sampling signal supplied to each of the sampling phase detectors in response to sampled DC output level.

* * * * *